United States Patent
Song et al.

(10) Patent No.: US 7,426,448 B2
(45) Date of Patent: Sep. 16, 2008

(54) METHOD AND APPARATUS FOR DIAGNOSING BROKEN SCAN CHAIN BASED ON LEAKAGE LIGHT EMISSION

(75) Inventors: Peilin Song, Lagrangeville, NY (US); Tian Xia, Burlington, VT (US); Alan J. Weger, Mohegan Lake, NY (US); Franco Stellari, Ho-Ho-Kus, NJ (US); Stanislav V. Polonsky, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 1138 days.

(21) Appl. No.: 10/771,218

(22) Filed: Feb. 3, 2004

(65) Prior Publication Data

US 2005/0168228 A1    Aug. 4, 2005

(51) Int. Cl.
G06F 19/00    (2006.01)

(52) U.S. Cl. .......................... 702/117; 712/16

(58) Field of Classification Search ............ 702/117, 702/182, 183, 184, 185; 712/16, 17, 18, 712/32
See application file for complete search history.

(56) References Cited

U.S. PATENT DOCUMENTS 6,490,702 B1 *  12/2002  Song et al. ............... 714/726
7,010,735 B2 *   3/2006  Motika et al. ............ 714/726

* cited by examiner

*Primary Examiner*—Edward Raymond
(74) *Attorney, Agent, or Firm*—Duke W. Yee; Thu Ann Dang; Gerald H. Glanzman

(57) ABSTRACT

A mechanism for diagnosing broken scan chains based on leakage light emission is provided. An image capture mechanism detects light emission from leakage current in complementary metal oxide semiconductor (CMOS) devices. The diagnosis mechanism identifies devices with unexpected light emission. An unexpected amount of light emission may indicate that a transistor is turned off when it should be turned on or vice versa. All possible inputs may be tested to determine whether a problem exists with transistors in latches or with transistors in clock buffers. Broken points in the scan chain may then be determined based on the locations of unexpected light emission.

1 Claim, 6 Drawing Sheets

METHOD AND APPARATUS FOR DIAGNOSING BROKEN SCAN CHAIN BASED ON LEAKAGE LIGHT EMISSION

BACKGROUND OF THE INVENTION

1. Technical Field

The present invention relates to integrated circuit technology and, in particular, to testing and diagnostics in a scan design. Still more particularly, the exemplary embodiments of the present invention provide a method and apparatus for diagnosing broken scan chains based on leakage light emission.

2. Description of Related Art

It is common for integrated circuit (IC) technology to use scan-based design methodologies and techniques to facilitate design, testing, and diagnostics. In scan design, especially full scan design, sequential circuits are converted into combinational circuits via scannable latches or flip-flops during testing. Using a scan-based design, structural testing may be more controllable and observable. Another aspect of using scan design is that the test cost is less than functional testing, especially for submicron designs.

FIG. 1 is a block diagram of a typical level-sensitive scan design (LSSD) circuit structure. Inputs are received by combinational logic 110 and the outputs of combinational logic 110 are received by scan chain latches 120. The outputs of scan chain latches 120 are controlled by scan clocks, system clocks, and scan register inputs (SRI).

The outputs of scan chain latches 120 are then provided to combinational logic 130 in the next level of the LSSD circuit structure. In turn, outputs from combinational logic 130 are received by scan chain latches 140. Scan register outputs (SRO) are provided from scan chain latches 120 to scan chain latches 140. The outputs of scan chain latches 140 are then provided to combinational logic 150 in the next level of the LSSD circuit structure. The outputs of combinational logic 150, as well as the scan register outputs from scan chain latches 140, are provided as outputs of the LSSD circuit.

A defect in an LSSD circuit structure may reside in combinatorial logic or in the scan latches. Thus, it becomes difficult to locate the exact location of the defect. For this reason, the scan chain itself may be analyzed to determine whether a defect exists in the scan chain. A scan chain may be broken if a wire is broken or shorted or if a component within a latch or clock buffer is not functioning properly. Problems in the scan chain must be corrected before the combinatorial logic may be analyzed.

FIG. 2 depicts a schematic diagram of an example LSSD scan chain configuration. Scan register input is received by a first set of latches. Each L1 latch receives scan register input and two clock signals, a-clk and $c_1$-clk. Each L2 latch receives the output of the L1 latch and clock input b-clk. During a scan test, the $c_1$-clk clock is not run, because the test is not concerned with data from the logic, only the function of the scan chain. The levels in the scan chain design are delineated by a plurality of shift, or scan, register latches (SRL).

If the scan chain is not working or is defective, scan chain diagnostics should be performed. In other words, the exact defect location should be localized. Scan diagnostics becomes important with shrinking lithography and increasing chip size, because more and more latches are added to new designs and this trend will continue. For example, the IBM G6 S/390 microprocessor in 1999 had about 76,000 scannable latches and the latest IBM S/390 zSeries 900 microprocessor in 2001 had more than 110,000 scannable latches. In some cases, these latches occupy as much as 30% of the overall chip area. As a result, about 10% to 30% of defects that occur on a whole chip may cause the scan chain to fail. Therefore, rapidly identifying the defect type of the scan chain may significantly improve the overall manufacturing yield.

Several scan diagnostics methods have been proposed in the past decade. Schafer et al., "Partner SRLs for Improved Shift Register Diagnostics," IEEE VLSI Test Symposium, pp. 198-201, 1992, introduces a reconfiguration of the scan chain for scan chain diagnostic purposes. A stuck-at fault on a scan chain can be captured in the partner shift register latches. The limitation is that both the shift register and the associated partner shift register cannot be defective at the same time. Narayanan et al., "An Efficient Scheme to Diagnose Scan Chain," Proc. International Test Conference, pp. 704-713, 1997, proposes modifying the existing scannable flop to add set/reset capability. Therefore, a broken scan chain may be easily diagnosed. Similarly, Wu, "Diagnosis of Scan Chain Failures," Proc. International Symposium on Defect and Fault Tolerance in VLSI Systems, pp. 217-222, 1998, proposes adding some overhead to the scan flops in order to flip or set/reset the scan flip-flops. A bidirectional scan chain design is proposed in Song, "A New Scan Structure for Improving Scan Chain Diagnosis and Delay Fault Coverage," $9^{th}$ IEEE North Atlantic Test Workshop, pp. 14-18, 2000, where the scan fault can be diagnosed by performing both forward and backward scan tests. In Song et al., "Scan Structure for Improving Transition Fault Coverage and Scan Diagnostics," U.S. Pat. No. 6,490,702, December 2002, a modified scan chain is proposed for accurate scan chain diagnostics.

Not only the scan chain may be diagnosed with added hardware, but software may also be used for diagnosis. Kundu, "On Diagnosis of Faults in a Scan Chain," IEEE VLSI Test Symposium, pp. 303-308, 1993, introduces the use of a sequential automatic test pattern generator (ATPG) technique that diagnoses faults in a scan chain. In Stanley, "High Accuracy Fault and Scan Software Diagnostic," $1^{st}$ IEEE Workshop on Field Optimization & Test, 2000, a fault simulation and matching algorithm are used to find the best scan fault candidates. In Guo et al., "A Technique for Fault Diagnosis of Defects in Scan Chain," Proc. International Test Conference, pp. 268-277, 2001, the ATPG patterns are applied to identify the range of suspect scan chain and further to simulate the faults in the suspect range for resolution purposes. The above approaches rely on extensive fault simulation and a large amount of data collection. These approaches also assume that the logic between scan chains is fault free.

SUMMARY OF THE INVENTION

A mechanism for diagnosing broken scan chains based on leakage light emission is provided. An image capture mechanism detects light emission from leakage current in complementary metal oxide semiconductor (CMOS) devices. The diagnosis mechanism identifies devices with unexpected light emission. An unexpected amount of light emission may indicate that a transistor is turned off when it should be turned on or vice versa. All possible inputs may be tested to determine whether a problem exists with transistors in latches or with transistors in clock buffers. Broken points in the scan chain may then be determined based on the locations of unexpected light emission.

BRIEF DESCRIPTION OF THE DRAWINGS

The invention itself, as well as a preferred mode of use, further objectives and advantages thereof, will best be understood by reference to the following detailed description of an illustrative embodiment when read in conjunction with the accompanying drawings, wherein.

DETAILED DESCRIPTION OF THE EXEMPLARY EMBODIMENTS

Figure 1:
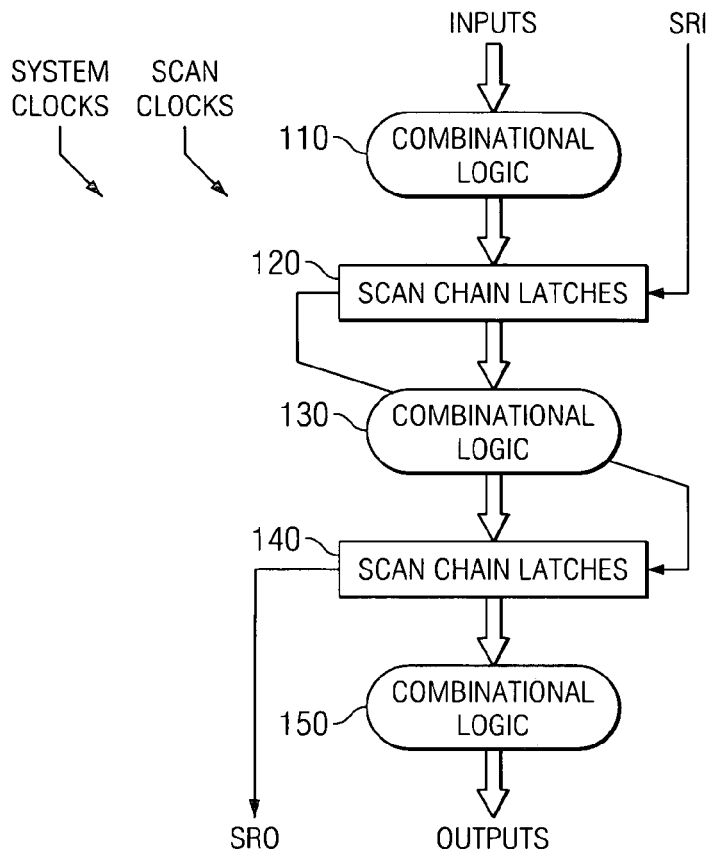
FIG. 1 is a block diagram of a typical level-sensitive scan design circuit structure.
Figure 2:
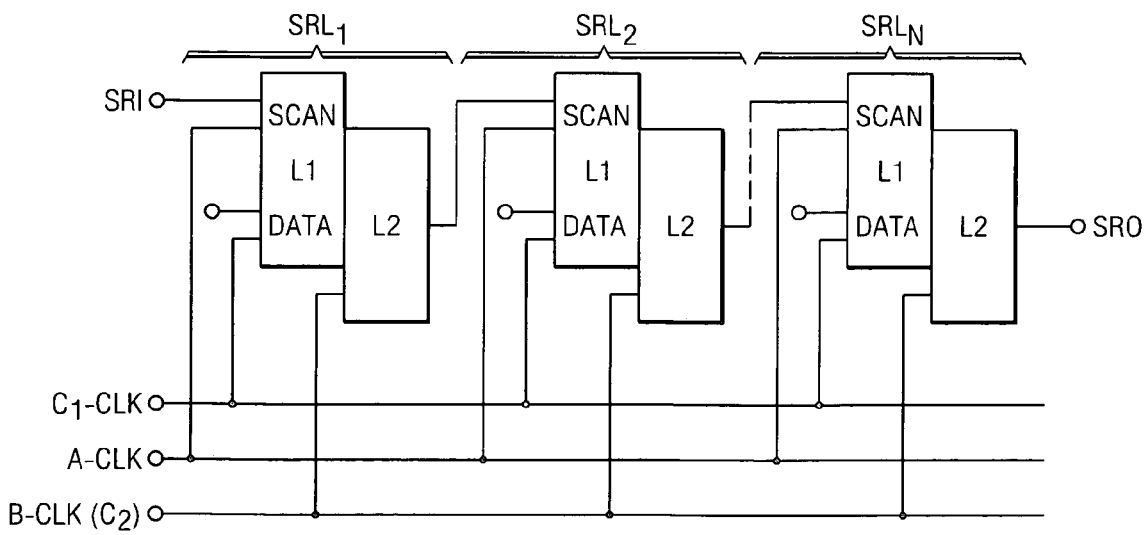
FIG. 2 depicts a schematic diagram of an example scan chain configuration.
Figure 3A:
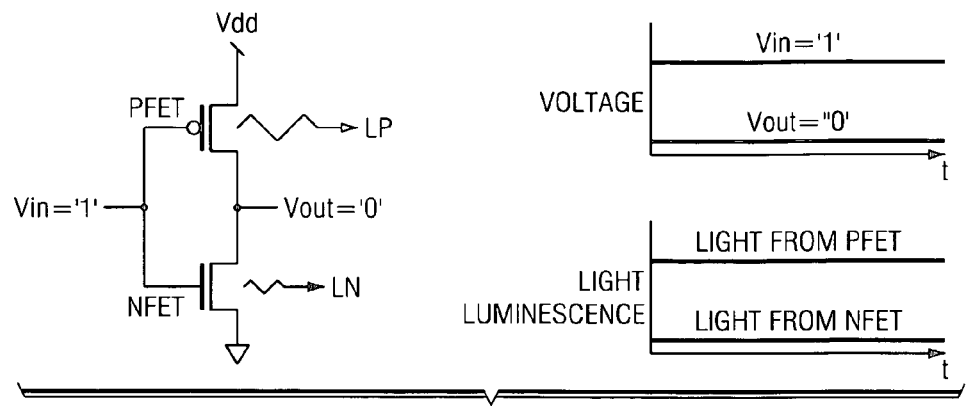
FIGS. 3A and 3B illustrate example inverter devices and resulting light emission in accordance with an exemplary embodiment of the present invention.
Figure 3B:
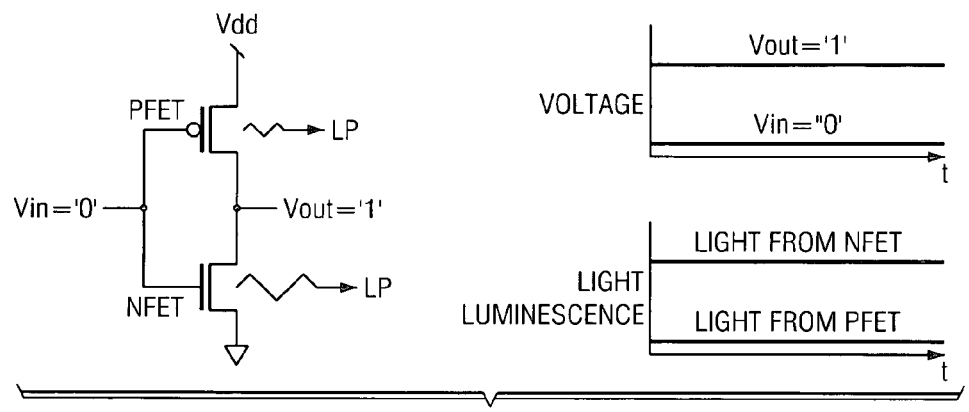

With reference now to the figures, FIGS. 3A and 3B illustrate example inverter devices and resulting light emission in accordance with an exemplary embodiment of the present invention. More particularly, in the example depicted in FIG. 3A, an inverter device includes a positive channel metal oxide semiconductor (PMOS) field effect transistor (PFET) and a negative channel metal oxide semiconductor (NMOS) field effect transistor (NFET). When the input voltage is a logical "1" (Vin=1), the PFET transistor being off and the NFET transistor being on. This results in the output voltage being a logical "0" (Vout=0). Leakage light emission from sub-micron CMOS technology may be observed as near infrared light. Since the voltage is fully across the PFET, the leakage light emission from the PFET is greater than that from the NFET.

In the example depicted in FIG. 3B, the input voltage is a logical "0" (Vin=0). Thus, the PFET is on and the NFET is off. This results in the output voltage being a logical "1" (Vout=1). In this case, the voltage is fully across the NFET and the leakage light emission from the NFET is greater than that from the PFET.

If the locations of the PFET and NFET are known, the logical state of the inverter may be detected based on leakage light emission. Thus, if there is a defect in the inverter causing a logic fault, the light emission will be different from the expected light emission. This light emission difference may be utilized for defect localization.

Figure 4:
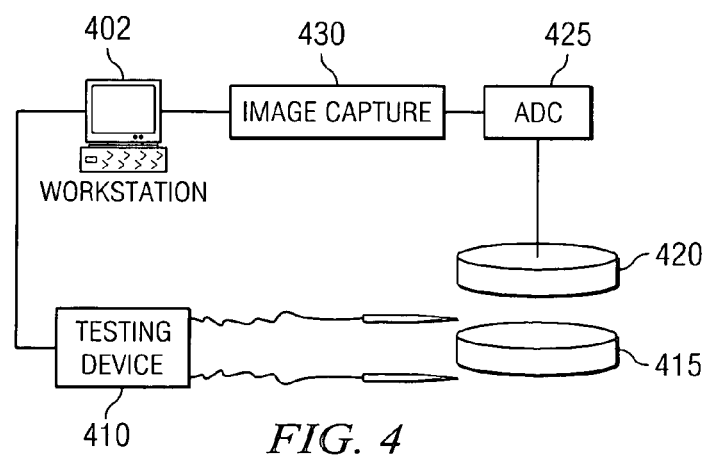
FIG. 4 illustrates a test and diagnosis configuration in accordance with an exemplary embodiment of the present invention.

FIG. 4 illustrates a test and diagnosis configuration in accordance with an exemplary embodiment of the present invention. A workstation processor 402 is connected to testing device 410. The testing device includes probes for applying voltages to an LSSD circuit structure on a wafer 415. More particularly, the testing device may be used to apply scan register input and clock inputs to the scan chain design.

A light detection device 420 detects light form components on wafer or chip 415. The light detection device may be, for example, a charge coupled device (CCD). A CCD is an electronic memory that can be charged by light. CCDs can hold a variable charge and are commonly used in cameras and scanners to record variable shades of light. CCDs are analog, not digital, and are made of a special type of MOS transistor. While the example described above uses a CCD for a light detection device, other detection devices may also be used, such as MCT. Analog to digital converters (ADC) 425 may be used to quantify the variable charge into a discrete number of colors. The color signals are received by image capture device 430, which supplies image data to workstation 402.

For a given very large scale integration (VLSI) scan-based design, each latch may always have been receiving and driving inverters along the scan path. Therefore, the transistors in the inverters may be used for leakage light emission detection. However, leakage light emission from any transistor along the scan path may also be taken for analysis. Abnormal emission indicates a broken point in the scan chain. Sometimes, a defect that causes a broken scan chain is in the scan clock tree. This can be verified by measuring the scan clock input to the latch. Based on the same principle, a bad clock tree may be diagnosed. However, all possible inputs may be provided by testing device 410 in testing a scan-based design to locate any defects that may appear in the scan path. Workstation 402 may then analyze the image data from image capture 430 to identify unexpected leakage light emission.

Figure 5:
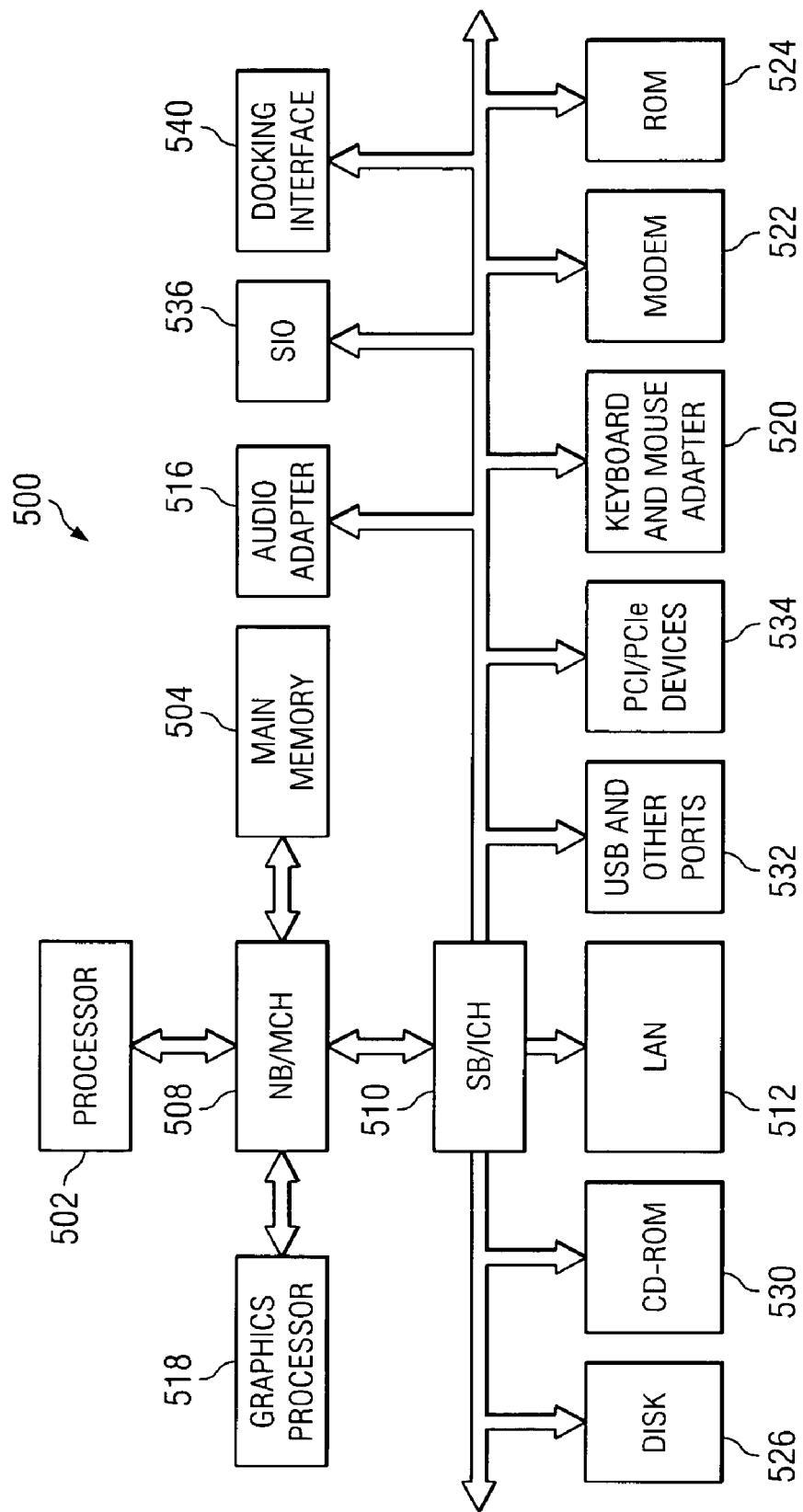
FIG. 5 is a block diagram of a data processing system in which the exemplary embodiments of the present invention may be implemented.

With reference now to FIG. 5, a block diagram of a data processing system is shown in which the exemplary embodiments of the present invention may be implemented. Data processing system 500 is an example of a computer, such as workstation 402 in FIG. 4, in which code or instructions implementing the processes of the present invention may be located. In the depicted example, data processing system 500 employs a hub architecture including a north bridge and memory controller hub (MCH) 508 and a south bridge and input/output (I/O) controller hub (ICH) 510. Processor 502, main memory 504, and graphics processor 518 are connected to MCH 508. Graphics processor 518 may be connected to the MCH through an accelerated graphics port (AGP), for example.

In the depicted example, local area network (LAN) adapter 512, audio adapter 516, keyboard and mouse adapter 520, modem 522, read only memory (ROM) 524, hard disk drive (HDD) 526, CD-ROM driver 530, universal serial bus (USB) ports and other communications ports 532, and PCI/PCIe devices 534 may be connected to ICH 510. PCI/PCIe devices may include, for example, Ethernet adapters, add-in cards, PC cards for notebook computers, etc. PCI uses a cardbus controller, while PCIe does not. ROM 524 may be, for example, a flash binary input/output system (BIOS). Hard disk drive 526 and CD-ROM drive 530 may use, for example, an integrated drive electronics (IDE) or serial advanced technology attachment (SATA) interface. A super I/O (SIO) device 536 may be connected to ICH 510.

An operating system runs on processor 502 and is used to coordinate and provide control of various components within data processing system 500 in FIG. 5. The operating system may be a commercially available operating system such as Linux, which is available from various distribution companies. An object oriented programming system such as Java or C++ may run in conjunction with the operating system and provides calls to the operating system from Java programs or applications executing on data processing system 500. "Java" is a trademark of Sun Microsystems, Inc. Instructions for the operating system, the object-oriented programming system, and applications or programs are located on storage devices, such as hard disk drive 526, and may be loaded into main memory 504 for execution by processor 502. The processes of the present invention are performed by processor 502 using computer implemented instructions, which may be located in a memory such as, for example, main memory 504, memory 524, or in one or more peripheral devices 526 and 530.

Those of ordinary skill in the art will appreciate that the hardware in FIG. 5 may vary depending on the implementation. Other internal hardware or peripheral devices, such as flash memory, equivalent non-volatile memory, or optical disk drives and the like, may be used in addition to or in place of the hardware depicted in FIG. 5. Also, the processes described herein may be applied to a multiprocessor data processing system.

Figure 6A:
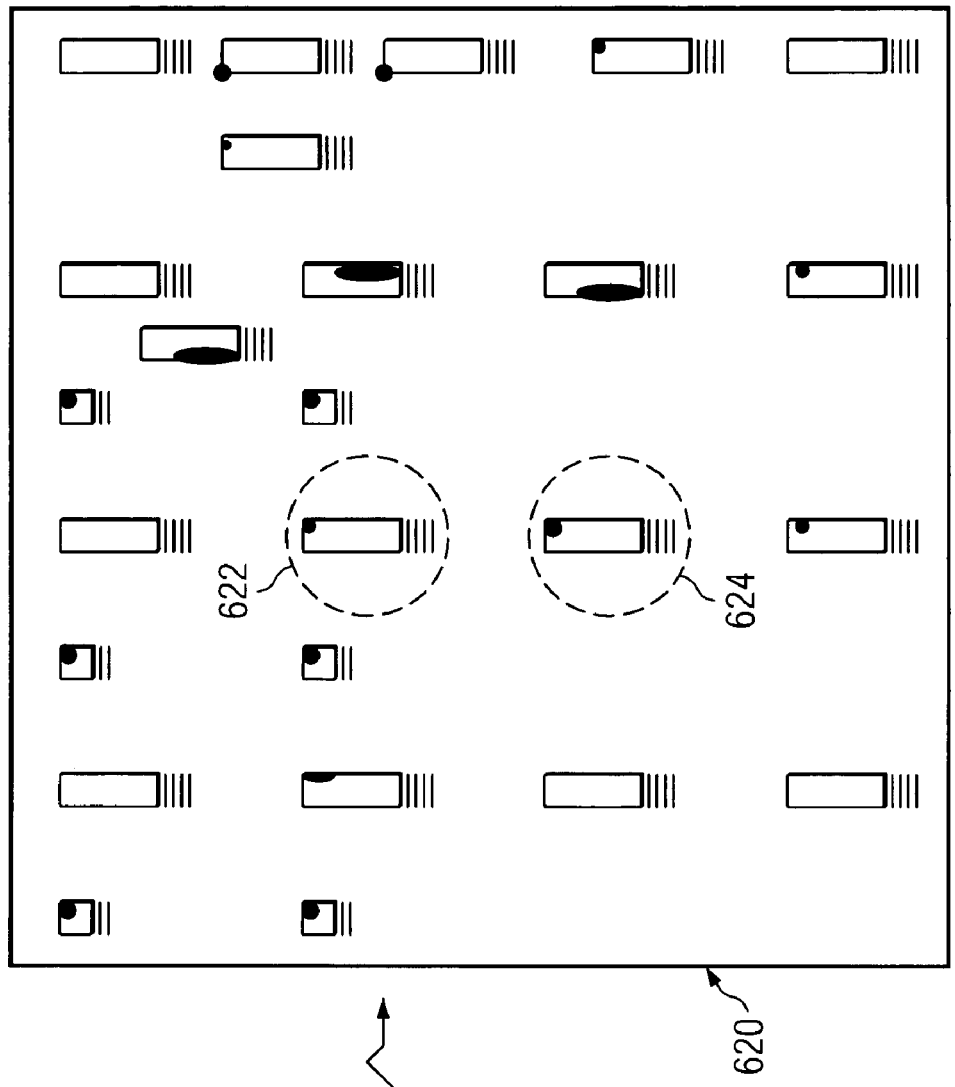
FIGS. 6A and 6B are examples of leakage light emission images in accordance with an exemplary embodiment of the present invention.
Figure 6B:
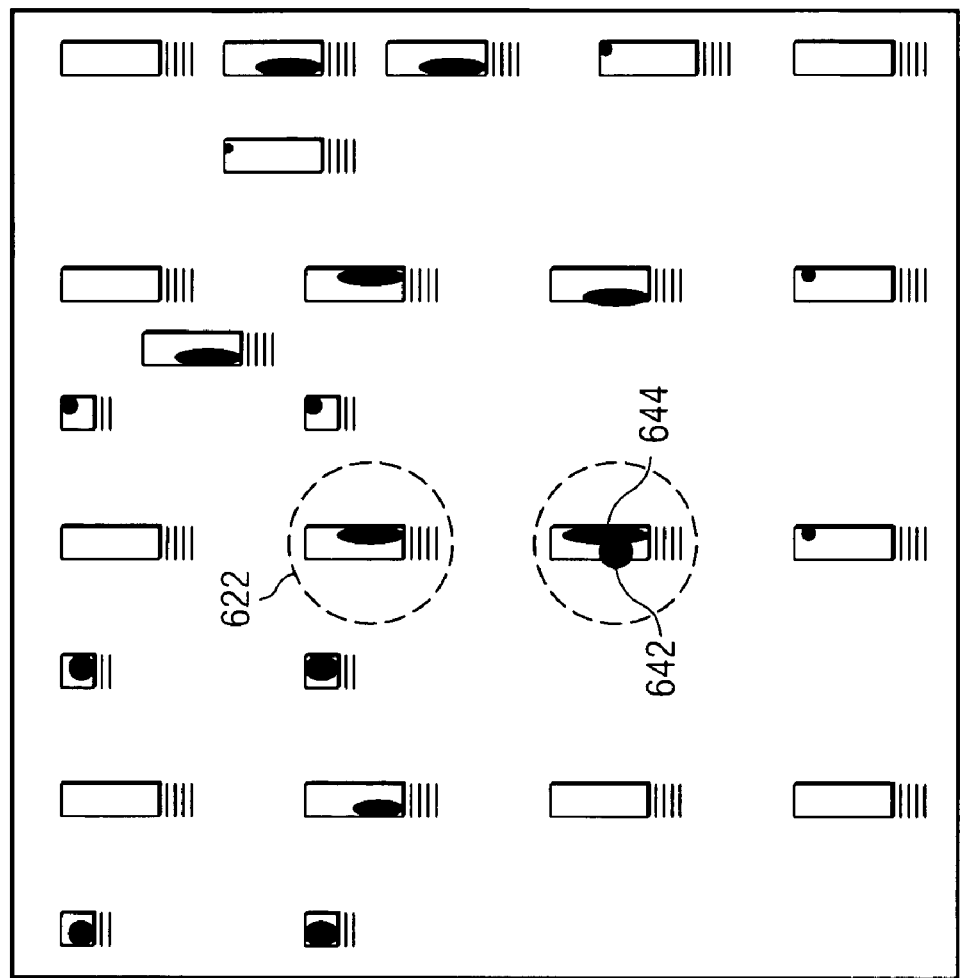
Figure 6B:
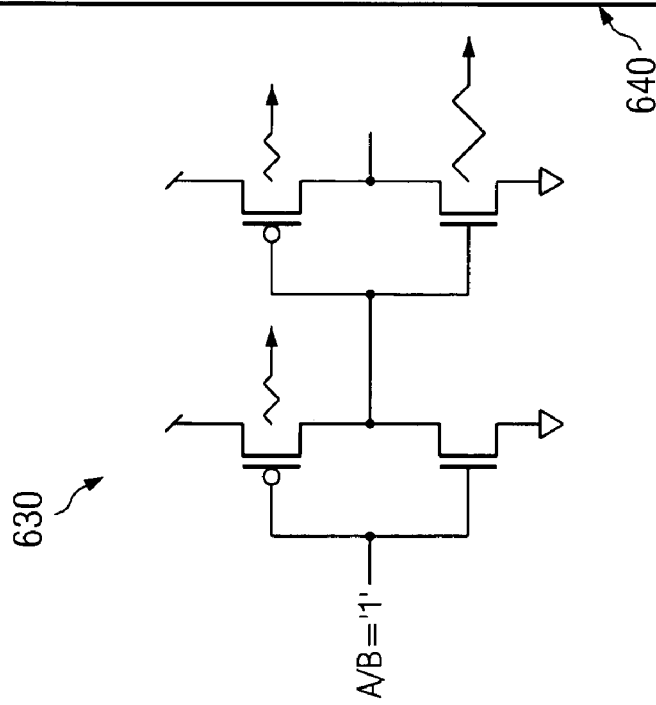

FIGS. 6A and 6B are examples of leakage light emission images in accordance with an exemplary embodiment of the present invention. More particularly, FIG. 6A illustrates leakage light emission from two inverters when the input is a logical "0." Circuit component 610 includes two inverters, wherein each inverter includes a PFET and a NFET, as described above with respect to FIGS. 3A and 3B. The NFET of the first inverter has a greater leakage light emission and the PFET of the second inverter has a greater leakage light emission. Leakage light emission image 620 illustrates the light emitted from various components, such as inverters 622, 624. Inverter 624 may be the second inverter shown in circuit component 610, for example. The example depicted in FIG. 6A, there is no unexpected light emission.

FIG. 6B illustrates leakage light emission from two inverters when the input is a logical "1." Circuit component 630 includes two inverters, wherein each inverter includes a PFET and a NFET. The PFET of the first inverter is expected to have greater leakage light emission and the NFET of the second inverter is expected to have greater leakage light emission. As seen in leakage light emission image 640, the NFET 644 of the second inverter is high, as expected. However, the PFET 642 of the second inverter is also noticeably high. Thus, a defect location is observed, since the PFET 642 has an unexpectedly high leakage light emission.

Figure 7:
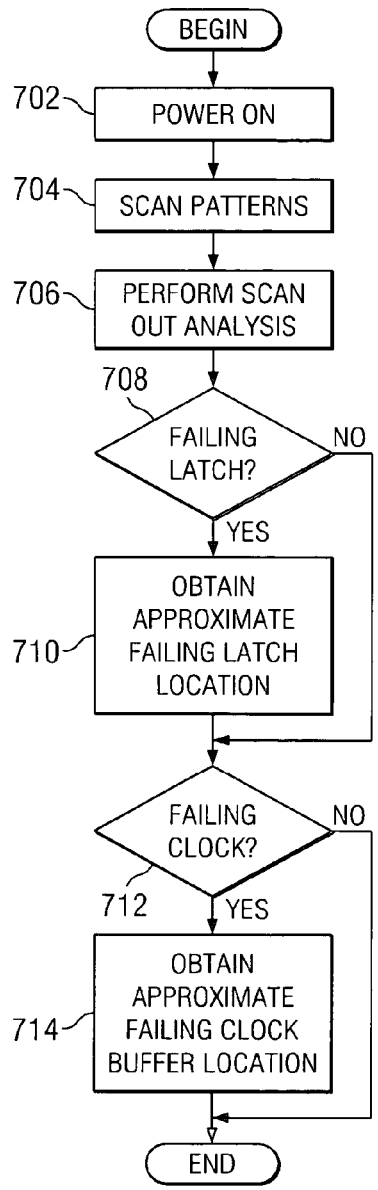
FIG. 7 is a flowchart illustrating an electrical diagnosis process in accordance with an exemplary embodiment of the present invention.

FIG. 7 is a flowchart illustrating an electrical diagnosis process in accordance with an exemplary embodiment of the present invention. The process begins and powers on the circuit (step 702). Then, the process applies scan patterns to the scan register inputs and clocks (step 704) and performs scan out analysis (step 706). A determination is made as to whether there are one or more failing latches (step 708). If there are failing latches, the process obtains approximate locations of the failing latches (step 710).

If there are no failing latches in step 708 or after obtaining approximate locations of failing latches in step 710, a determination is made as to whether there are one or more failing clocks (step 712). If there are no failing clocks the process ends. Otherwise, if there are failing clocks in step 712, the process obtains approximate locations of failing clock buffers (step 714) and ends.

Figure 8:
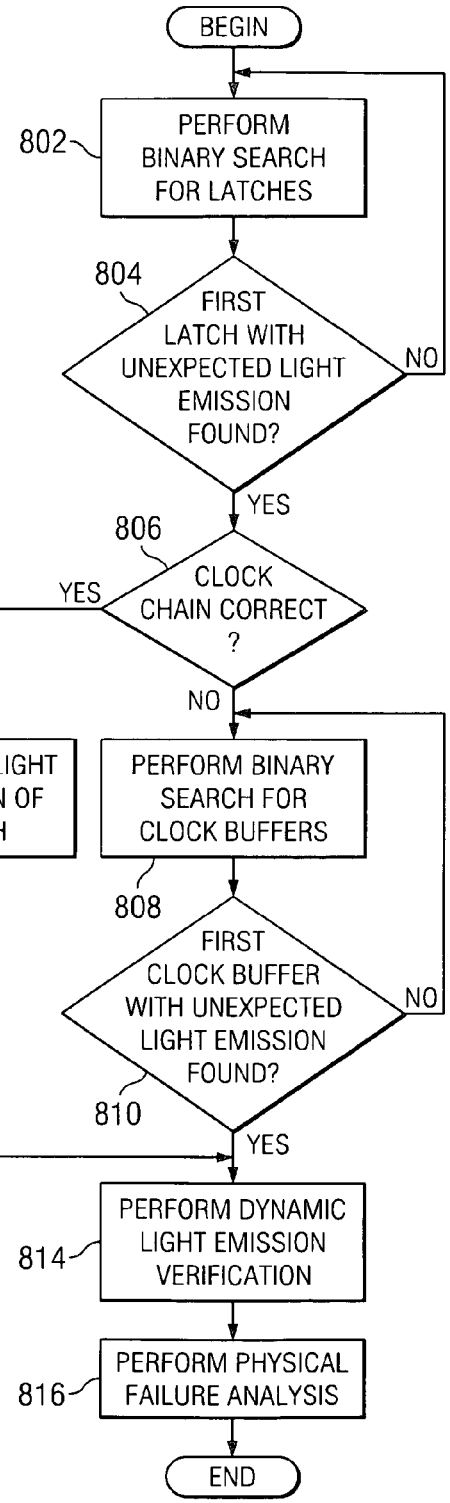
FIG. 8 is a flowchart illustrating an image diagnosis process in accordance with an exemplary embodiment of the present invention.

FIG. 8 is a flowchart illustrating an image diagnosis process in accordance with an exemplary embodiment of the present invention. Given the approximate locations of failing latches and failing clocks, the image diagnosis process then inspects the light emission from the circuit components to verify failing components. The process begins and performs a binary search for latches (step 802). The binary search is performed, for example, by starting with the last latch. If the last latch has an unexpected logical value based on the leakage light emission, then the latches before that latch are divided in half and the latch at the half-way point is inspected. If that latch has an unexpected logical value based on the leakage light emission, then the latches before that latch are divided in half and so on. However if the latch at the half-way point does not have an unexpected logical value, then the latches between that latch and the last latch are divided in half.

At each point, a determination is made as to whether the latch is the first latch with unexpected light emission (step 804). If the current latch is not the first latch with unexpected light emission, then the process returns to step 802 to repeat the search. When the first latch with unexpected light emission is found in step 804, a determination is made as to whether the clock chain is correct (step 806).

If the clock chain is correct, the process performs a binary search for clock buffers (step 808) in a manner similar to the binary search for latches. However, if the clock chain is correct, the process continues to step 812 to analyze light emission of the latch. At each point in the binary search in step 808, a determination is made as to whether the latch is the first clock buffer with unexpected light emission (step 810). If the current buffer is not the first buffer with unexpected light emission, then the process returns to step 808 to repeat the search.

When the first buffer with unexpected light emission is found in step 810, or after analyzing the light emission of the latch in step 812, the process performs dynamic light emission verification (step 814), such as using picosecond imaging circuit analysis (PICA). Thereafter, the process performs physical failure analysis (step 816) and ends. Physical failure analysis is a method of finding a root cause of failures, such as fabrication defect, design flaw, etc. Physical failure analysis techniques are generally known in the art and are not a primary focus of the exemplary embodiments of the present invention.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for diagnosing a scan chain, the method comprising:
   performing scan out analysis on a scan chain design;
   obtaining approximate locations of failed components in the scan chain design based on the scan out analysis,
   inspecting leakage light emission from components in the scan chain design based on the approximate locations of failed components, wherein inspecting leakage light emission from components comprises:

performing a binary search of latches in the scan chain design to identify a latch with an unexpected light emission;

responsive to identifying the latch with an unexpected light emission, determining whether a clock chain is correct;

responsive to a determination that the clock chain is correct, analyzing the light emission of the latch;

responsive to a determination that the clock chain is not correct, performing a binary search of clock buffers in the scan chain to identify a buffer with an unexpected light emission;

performing dynamic light emission verification; and perform physical failure analysis.

* * * * *